(12) United States Patent
Sanchez

(10) Patent No.: US 8,823,454 B2
(45) Date of Patent: Sep. 2, 2014

(54) FULLY COMPLEMENTARY SELF-BIASED DIFFERENTIAL RECEIVER WITH STARTUP CIRCUIT

(75) Inventor: Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 13/435,981

(22) Filed: Mar. 30, 2012

(65) Prior Publication Data

US 2013/0257513 A1     Oct. 3, 2013

(51) Int. Cl.
*H03F 3/45* (2006.01)

(52) U.S. Cl.
USPC .......................................... 330/261

(58) Field of Classification Search
USPC .......................................... 330/253, 259, 261
See application file for complete search history.

(56) References Cited

U.S. PATENT DOCUMENTS

| | | | | |
|---|---|---|---|---|
| 4,336,615 | A * | 6/1982 | Abt et al. ........................ | 455/108 |
| 4,937,476 | A | 6/1990 | Bazes | |
| 4,958,133 | A | 9/1990 | Bazes | |
| 5,703,532 | A | 12/1997 | Shin et al. | |
| 6,046,638 | A * | 4/2000 | Hogeboom ................... | 330/252 |
| 6,169,424 | B1 | 1/2001 | Kurd | |
| 6,304,141 | B1 | 10/2001 | Kennedy et al. | |
| 6,452,429 | B1 | 9/2002 | Lim | |
| 6,696,894 | B1 * | 2/2004 | Huang .......................... | 330/253 |
| 6,738,432 | B2 * | 5/2004 | Pehlke et al. ................. | 375/300 |
| 6,804,305 | B1 | 10/2004 | Chan | |
| 6,924,702 | B2 | 8/2005 | Chen | |
| 7,236,019 | B2 | 6/2007 | Cowles et al. | |
| 7,924,067 | B2 | 4/2011 | Cowles et al. | |

OTHER PUBLICATIONS

Bazes, Mel, "Two Novel Fully Complementary Self-Biased CMOS Differential Amplifiers," IEEE Journal of Solid-State Circuits, vol. 26, No. 2, Feb. 1991; pp. 165-168.
"Set." Merriam-Webster.com. Merriam-Webster, n.d. Web. retrieved Dec. 20, 2013 from <<http://www.merriam-webster.com/dictionary/set>>, 2 pages.

* cited by examiner

*Primary Examiner* — Steven J Mottola

(57) ABSTRACT

In accordance with at least one embodiment, an improved voltage headroom self-biased receiver is provided. In accordance with at least one embodiment, tail current sources are biased so as to be cross-coupled with respect to each other. In accordance with at least one embodiment, startup control is provided to counter defect-induced current and to ensure the circuit can function properly even with large amounts of defect current. In accordance with at least one embodiment, a positive type (p type) channel metal oxide semiconductor (PMOS) tail current transistor is modulated by a negative type (n type) channel metal oxide semiconductor (NMOS) differential pair virtual negative supply voltage and a NMOS tail current transistor is modulated by a PMOS differential pair virtual positive supply voltage. The amplifier's output common mode is thus self correcting to p type to n type transistor strength differences.

19 Claims, 6 Drawing Sheets

US 8,823,454 B2

FULLY COMPLEMENTARY SELF-BIASED DIFFERENTIAL RECEIVER WITH STARTUP CIRCUIT

BACKGROUND

1. Field of the Disclosure

The present disclosure relates generally to differential receivers and, more particularly, to complementary self-biased differential amplifiers.

2. Description of the Related Art

As electronic devices become more sophisticated and consumers expect increased functionality, small device size, and extended battery life, techniques are utilized to reduce device size and decrease power consumption without sacrificing functionality. One such technique involves operating an electronic device at a low voltage. However, low voltage operation can present obstacles to achieving the desired functionality.

One technique to implement lower voltage operation is to employ differential signaling, whereby a differential receiver is used to receive differential mode signals from other devices. Some differential receivers use self-biased differential amplifiers. However, as operating voltages are reduced conventional self-biased amplifiers suffer from low speed, and can also demand a large circuit area. For example, some self-biased amplifier topologies require stacks of transistors dedicated specifically to providing a self-biasing voltage, and such self-biasing transistor stacks occupy large amounts of area, interfering with the quest for smaller electronic devices. Moreover, limited output swing and intolerance to variations in process, voltage, and temperature (PVT) further hinder use of typical self-biased amplifier topologies. For example, at low supply voltage differences (i.e., low positive supply voltage (Vdd) relative to negative supply voltage), in typical self-biased amplifiers, tail current sources are provided with relatively low bias relative to the threshold voltage (Vth) of the tail current source transistors, which inhibits proper operation of the circuit.

BRIEF DESCRIPTION OF THE SEVERAL VIEWS OF THE DRAWINGS

The present disclosure may be better understood, and its features made apparent to those skilled in the art by referencing the accompanying drawings.

The use of the same reference symbols in different drawings indicates similar or identical items.

DETAILED DESCRIPTION OF THE INVENTION

The bias voltages for a self-biased amplifier are modulated to provide improved PVT tolerance. For example, if transistors of a first conductivity type are strong, but transistors of a second conductivity type are weak, then a virtual positive bias voltage (e.g., BIASN) applied to a negative tail current source rises in potential to compensate for the weakness of the transistors of the second conductivity type. Such compensation allows the amplifier to operate effectively for a wider range of input signals.

Figure 1:
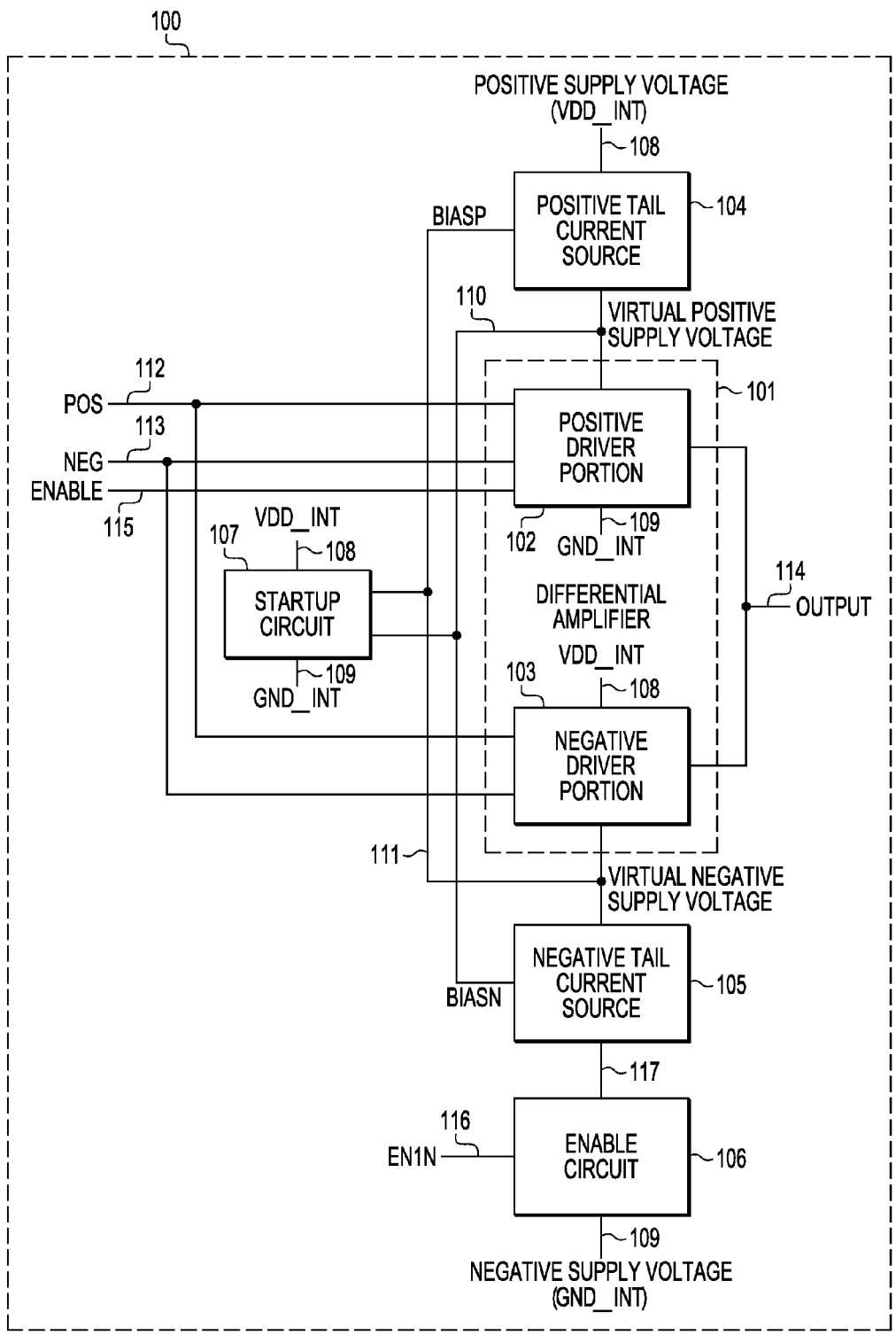
FIG. 1 is a block diagram illustrating a complementary self-biasing amplifier in accordance with at least one embodiment.

FIG. 1 is a block diagram illustrating a complementary self-biasing amplifier 100 in accordance with at least one embodiment. The self-biased complementary differential amplifier 100 comprises driver portion 101, positive tail current source 104, negative tail current source 105, enable circuit 106, and startup circuit 107. Driver portion 101 comprises positive driver portion 102 and negative driver portion 103. A positive supply voltage (e.g., VDD_INT) 108 is connected to a positive tail current source 104. The positive tail current source 104 provides a virtual positive supply voltage (e.g., BIASN) 110, which is connected from the positive tail current source 104 to positive driver portion 102, to negative tail current source 105, and to startup circuit 107.

A negative supply voltage (e.g., GND_INT) 109, connected to an enable circuit 106. The enable circuit 106 enables operation of the differential amplifier (e.g., driver portion 101) as a function of an enable state of enable input (e.g., EN1N) 116. The enable circuit 106 is coupled to a negative tail current source 105 via node 117. The negative tail current source 105 provides a virtual negative supply voltage (e.g., BIASP) 111, which is coupled from negative tail current source 105 to negative driver portion 103, to positive tail current source 104, and to startup circuit 107.

A positive differential signal input 112 is provided to positive driver portion 102 and to negative driver portion 103. A negative differential signal input 113 is provided to positive driver portion 102 and to negative driver portion 103. An enable signal (e.g., ENABLE) 115 is provided to positive driver portion 102. In accordance with at least one embodiment, enable signal (e.g., ENABLE) 115 (or its inverse/complement) may also be applied to enable input (e.g., EN1N) 116. The positive driver portion 102 and the negative driver portion 103 are connected to output 114 to which and output signal is provided. The positive supply voltage (e.g., VDD_INT) 108 is provided to startup circuit 107 and to negative driver portion 103. The negative supply voltage (e.g., GND_INT) 109 is provided to startup circuit 107 and to positive driver portion 102.

The virtual positive supply voltage 110 biases negative tail current source 105. The virtual negative supply voltage 111 biases positive tail current source 104. Startup circuit 107 compensates for defect currents resulting from defects arising from semiconductor fabrication processes and ensures reliable operation of the differential amplifier upon application of power to the differential amplifier.

In accordance with at least one embodiment, a complementary enable circuit may be interposed between positive supply voltage 108 and positive tail current source 104 in a manner similar to that by which enable circuit 106 is situated between negative supply voltage 109 and negative tail current source 105. Positive supply voltage (e.g., VDD_INT) 108 is connected to the complementary enable circuit. The complementary enable circuit enables operation of the differential amplifier (e.g., driver portion 101) as a function of a complementary enable state of a complementary enable input (e.g., EN1P). The complementary enable circuit is coupled to positive tail current source 104 via a complementary enable circuit node.

In accordance with at least one embodiment, the same signal as (or an inverse/complement of) that applied to enable input (e.g., EN1N) 116 may be applied to the complementary enable input (e.g., EN1P). In accordance with at least one embodiment, enable signal (e.g., ENABLE) 115 (or its inverse/complement) may be applied to complementary enable input (e.g., EN1P).

In accordance with at least one embodiment, the supply voltage system spans negative supply voltage 109 to positive supply voltage 108. To assure proper operation, virtual positive supply voltage (BIASN) 110 should be more positive in voltage than virtual negative supply voltage (BIASP) 111, and, in fact, virtual positive supply voltage (BIASN) 110 will be close to positive supply voltage 108 and virtual negative supply voltage (BIASP) 111 will be close to negative supply voltage 109 when the circuit is working properly. However, in absence of startup circuit 107, it is theoretically possible that virtual positive supply voltage (BIASN) 110 and virtual negative supply voltage (BIASP) 111 could be relatively reversed in polarity since nothing else in this circuit would actively ensure their proper state. On power up, the positive supply voltage 108 is presumed to begin at the same potential as the negative supply voltage 109 (e.g., at zero volts (0V)). An active device in startup circuit 107 (e.g., a gate of a PMOS FET in startup circuit 107) is, in effect, turned on (e.g., by the influence of the zero volt (0V) initial potential) as the positive supply voltage 108 and/or negative supply voltage 109 starts to ramp to its specified voltage (or their specified voltages). This forces any charge in virtual negative supply voltage (BIASP) 111 to be dissipated to negative supply voltage 109. This causes the PMOS tail current devices to start pumping charge into the virtual positive supply voltage (BIASN) 110 (which started, for example, at a nominal zero volts (0V) and now starts rising). This feedback mechanism ensures proper power up as virtual negative supply voltage (BIASP) 111 is momentarily forced low to allow virtual positive supply voltage (BIASN) 110 to rise, and then NMOS tail current transistors engage to pull virtual positive supply voltage (BIASN) 110 toward its intended operating point with the help of PMOS tail current devices. As virtual positive supply voltage (BIASN) 110 rises and virtual negative supply voltage (BIASP) falls, startup circuit 107 (e.g., a PMOS startup transistor in startup circuit 107) shuts off, as its gate rises in potential while its source falls in potential.

It is possible that a semiconductor device defect can exist that causes an effective injection of charge into virtual positive supply voltage (BIASN) 110 and virtual negative supply voltage (BIASP) 111. A startup transistor (e.g., a PMOS FET in startup circuit 107) is sized to handle a significant amount of defect current such that, on power up, it can "defeat" up to, for example, a three microampere (3 µA) defect applied at both the virtual positive supply voltage (BIASN) 110 and the virtual negative supply voltage (BIASP) 111.

Figure 2:
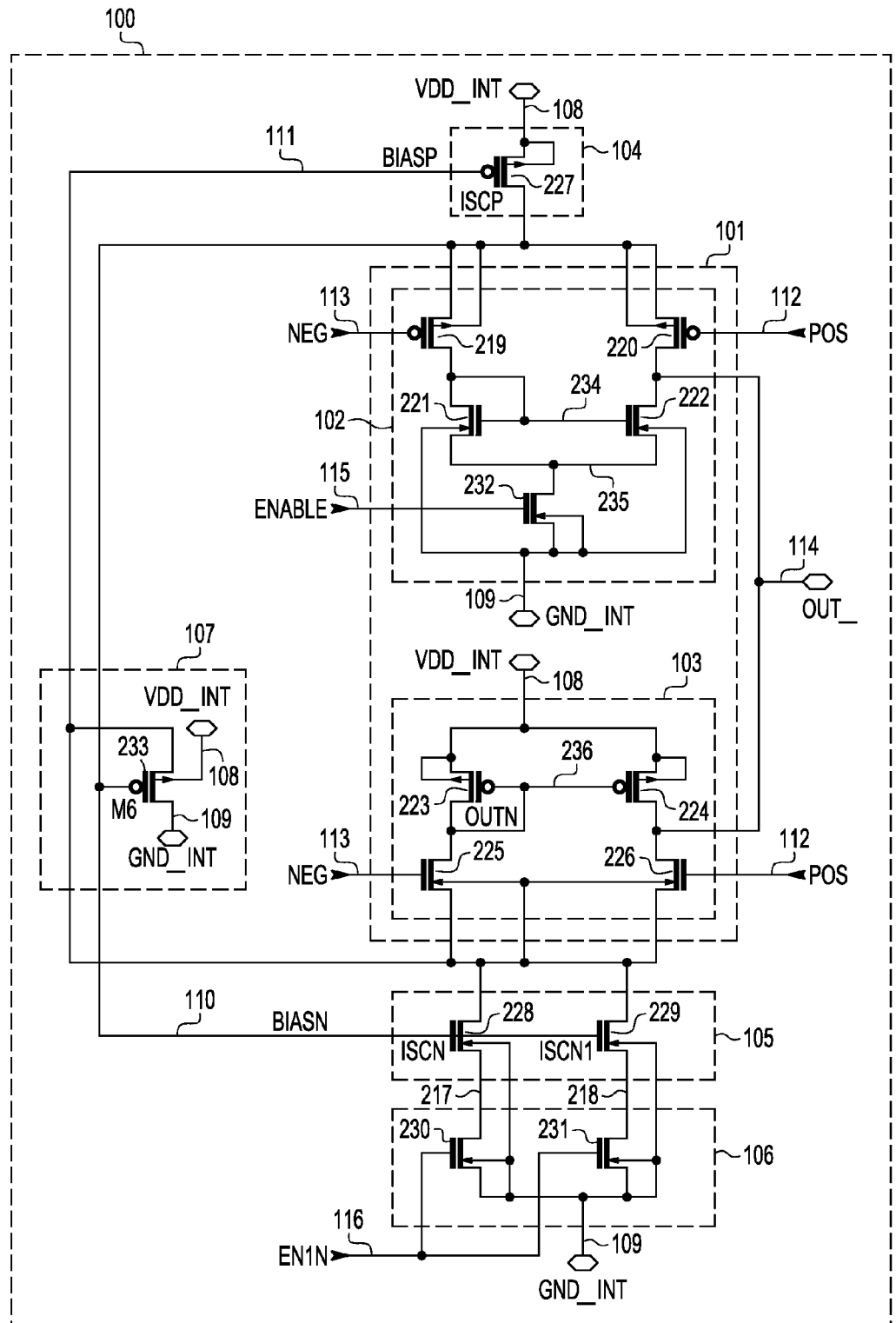
FIG. 2 is a schematic diagram illustrating a complementary self-biasing amplifier in accordance with at least one embodiment.

FIG. 2 is a schematic diagram illustrating a specific embodiment of the complementary self-biasing amplifier of FIG. 1 in accordance with at least one embodiment. The complementary self-biasing amplifier 100 comprises positive tail current source 104, differential amplifier 101, negative tail current source 105, enable circuit 106, and startup circuit 107. Positive tail current source 104 comprises positive type (p type) channel metal oxide semiconductor (PMOS) field effect transistor (FET) 227. The positive tail current source 104 functions as a current source controlled by the virtual negative supply voltage applied to the gate of the PMOS FET 227, as moderated by the startup circuit 107.

Differential amplifier 101 comprises positive driver portion 102 and negative driver portion 103. Positive driver portion 102 comprises PMOS FET 219, PMOS FET 220, negative type (n type) channel metal oxide semiconductor (NMOS) field effect transistor (FET) 221, NMOS FET 222, and NMOS FET 232. Negative driver portion 103 comprises PMOS FET 223, PMOS FET 224, NMOS FET 225, and NMOS FET 226. The positive driver portion 102 receives positive input signal 112 and negative input signal 113 and provides output 114. The negative driver portion 103 receives positive input signal 112 and negative input signal 113 and provides output 114. The positive driver portion 102 and the negative driver portion 103 are completely complementary (i.e., each PMOS FET operates in a push-pull manner with a corresponding NMOS FET). The completely complementary nature of the cooperative operation of the positive driver portion 102 and the negative driver portion 103 provide a large input signal voltage range, with the differential amplifier working properly even over large swings of the voltages of the positive and negative input signals. The cross linked biasing technique improves and further extends the input signal voltage range as well as the output voltage range.

In positive driver portion 102, PMOS FETs 219 and 220 receive negative and positive input signals 113 and 112, respectively. NMOS FETs 221 and 222 form load devices, configured as a current mirror, reflecting the complementary current to the respective sides as the current is steered from the left side of positive driver portion 102 to the right side of positive driver portion 102 to help in or disengage from helping in driving the output 114. Positive tail current source 104 sets the maximum current flow through PMOS FET 219 and PMOS FET 220. The current through PMOS FET 219 and PMOS FET 220 is mostly limited by the gate-source voltage (Vgs) of PMOS FET 219 and PMOS FET 220. NMOS FET 232 allows the selective enabling and disabling of the positive driver portion 102 based on an enable signal (ENABLE) 115.

In the negative driver portion 103, NMOS FETs 225 and 226 receive negative and positive input signals 113 and 112, respectively, at their gates. NMOS FETs 223 and 224 form load devices, configured as a current mirror, reflecting the complementary current to the respective sides as the current is steered from the left side of negative driver portion 103 to the right side of negative driver portion 103 to help in or disengage from helping in driving the output 114. Negative tail current source 105 sets the maximum current flow through NMOS FET 225 and NMOS FET 226. The current through NMOS FET 225 and NMOS FET 226 is mostly limited by the gate-source voltage (Vgs) of NMOS FET 225 and NMOS FET 226.

Negative tail current source 105 comprises NMOS FET 228 and NMOS FET 229. Enable circuit 106 comprises NMOS FET 230 and NMOS FET 231. Startup circuit 107 comprises PMOS FET 233. The negative tail current source 105 functions as a current source controlled by the virtual positive supply voltage applied to the gates of the NMOS FETs 228 and 229, as moderated by the startup circuit 107. NMOS FETs 228 and 229 are configured to operate in parallel, with current flow through NMOS FETs 228 and 229, and therefore through negative driver portion 103, being selectively enabled and disabled by application of an enable signal (EN1N) 116 to the gate terminals of NMOS FETs 230 and 231. NMOS FET 230 enables and disables current flow through NMOS FET 228, and NMOS FET 231 enables and disables current flow through NMOS FET 229. In accordance with at least one embodiment, a separate left enable signal (EN1NL) is applied to the gate terminal of NMOS FET 230 and a separate right enable signal (EN1NR) is applied to the gate terminal of NMOS FET 231 to provide selectable amounts of current through NMOS FETs 228 and 229, respectively. Accordingly, negative tail current source 105 may be implemented as a programmable negative tail current source.

Positive supply voltage (e.g., VDD_INT) 108 is coupled to the source terminal and the body terminal of PMOS FET 227. The drain terminal of PMOS FET 227 is coupled to the virtual positive supply voltage node (e.g., BIASN) 110. The gate terminal of PMOS FET 227 is coupled to the virtual negative supply voltage node (e.g., BIASP) 111.

In accordance with at least one embodiment, positive tail current source 104 may be implemented with a transistor configuration complementary to that of negative tail current source 105. Also, positive tail current source 104 may be implemented as a programmable positive tail current source, for example, by applying a separate complementary left enable signal (EN1PL) to a gate terminal of a complementary left enable PMOS FET and a separate complementary right enable signal (EN1PR) to a gate terminal of a complementary right enable PMOS FET to provide selectable amounts of current through a complementary left bias cross-coupling PMOS FET coupled to the complementary left enable PMOS FET and a complementary right bias cross-coupling PMOS FET coupled to the complementary right enable PMOS FET, respectively.

Virtual positive supply voltage node 110 is also coupled to the source terminal and the body terminal of PMOS FET 219, to the source terminal and the body terminal of PMOS FET 220, to the gate terminal of PMOS FET 233, to the gate terminal of NMOS FET 228, and to the gate terminal of NMOS FET 229. The negative positive signal input 113 is coupled to the gate terminal of PMOS FET 219. The positive signal input 112 is coupled to the gate terminal of PMOS FET 220. The drain terminal of PMOS FET 219 is coupled to node 234, which is coupled to the drain terminal of NMOS FET 221, the gate terminal of NMOS FET 221, and the gate terminal of NMOS FET 222. The drain terminal of PMOS FET 220 is coupled to the drain terminal of NMOS FET 222 and to output terminal 114. The body terminal of NMOS FET 221 and the body terminal of NMOS FET 222 are coupled to negative supply voltage 109. The source terminal of NMOS FET 221 and the source terminal of NMOS FET 222 are coupled to node 235, which is coupled to the drain terminal of NMOS FET 232. Enable input 115 is coupled to the gate terminal of NMOS FET 232. The source terminal and the body terminal of NMOS FET 232 are coupled to negative supply voltage 109.

Positive supply voltage 108 is coupled to the source terminal and the body terminal of PMOS FET 223 and to the source terminal and the body terminal of PMOS FET 224. The gate terminal and the drain terminal of PMOS FET 223 are coupled to node 236, which is coupled to the gate terminal of PMOS FET 224, and to the drain terminal of NMOS FET 225. The drain terminal of PMOS FET 224 is coupled to the drain terminal of NMOS FET 226 and to output terminal 114. Negative signal input 113 is coupled to the gate terminal of NMOS FET 225. Positive signal input 112 is coupled to the gate terminal of PMOS FET 226. The source terminal and the gate terminal of NMOS FET 225 and the source terminal and the gate terminal of NMOS FET 226 are coupled to the virtual negative supply voltage node 111, which is coupled to the drain terminal of NMOS FET 228, the drain terminal of NMOS FET 229, to the source terminal of PMOS FET 233, and to the gate terminal of PMOS FET 227.

The source terminal of NMOS FET 228 is coupled to the drain terminal of NMOS FET 230. The source terminal of NMOS FET 229 is coupled to the drain terminal of NMOS FET 231. An enable input (e.g., EN1N) is coupled to the gate terminal of NMOS FET 230 and to the gate terminal of NMOS FET 231. The source terminal and the body terminal of NMOS FET 230 and the source terminal and the body terminal of NMOS FET 231 are coupled to negative supply voltage 109.

While startup circuit 107 is illustrated as comprising PMOS FET 233, it should be understood that, in accordance with at least one embodiment, startup circuit 107 may comprise an NMOS FET. As an example, a startup circuit comprising an NMOS FET may be useful in a modified circuit configuration where supply voltage 108 operates at a more negative voltage than supply voltage 109. For example, a source terminal of an NMOS FET of startup circuit 107 may be coupled to a relatively negative version of supply voltage 108, such that when the relatively negative supply voltage 108 powers down, then the NMOS FET of the startup circuit 107 injects charge.

Figure 3:
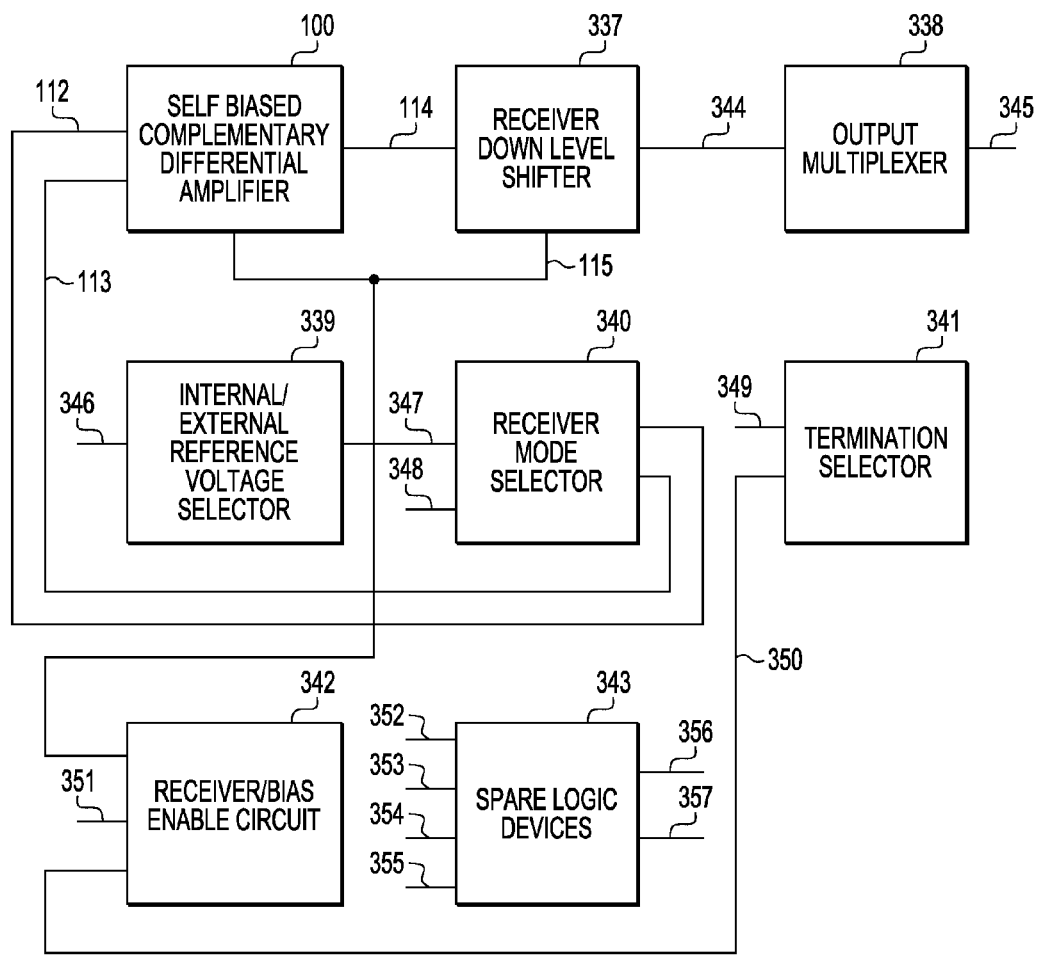
FIG. 3 is a block diagram of a system utilizing a complementary self-biasing amplifier in accordance with at least one embodiment.

FIG. 3 is a block diagram of a system utilizing a complementary self-biasing amplifier in accordance with at least one embodiment. The system comprises self-biased complementary differential amplifier 100, receiver down level shifter 337, output multiplexer 338, internal/external reference voltage selector 339, receiver mode selector 340, termination selector 341, receiver/bias enable circuit 342, and spare logic devices 343. A positive signal input 112 and a negative signal input 113 are coupled to self-biased complementary differential amplifier 100 and to receiver mode selector 340. An enable signal 115 from receiver/bias enable circuit 342 is coupled to self-biased complementary differential amplifier 100 and to receiver down level shifter 337. An output 114 from self-biased complementary differential amplifier 100 is coupled to receiver down level shifter 337. An output 344 from receiver down level shifter 337 is coupled to output multiplexer 338. Output multiplexer 338 provides an output 345.

A reference voltage selection signal 346 is coupled to internal/external reference voltage selector 339. Internal/external reference voltage selector 339 provides an output 347 to receiver mode selector 340. An input 348 is coupled to receiver mode selector 340. An input 349 is coupled to termination selector 341. Termination selector 341 is coupled to node 350, which is coupled to receiver/bias enable circuit 342. An input 351 is coupled to receiver/bias enable circuit 342. Inputs 352, 353, and 354 are coupled to spare logic devices 343 and may be used to provide output 356 from spare logic devices 343. Input 355 is coupled to spare logic devices 343 and may be used to provide output 357 from spare logic devices 343.

Figure 4:
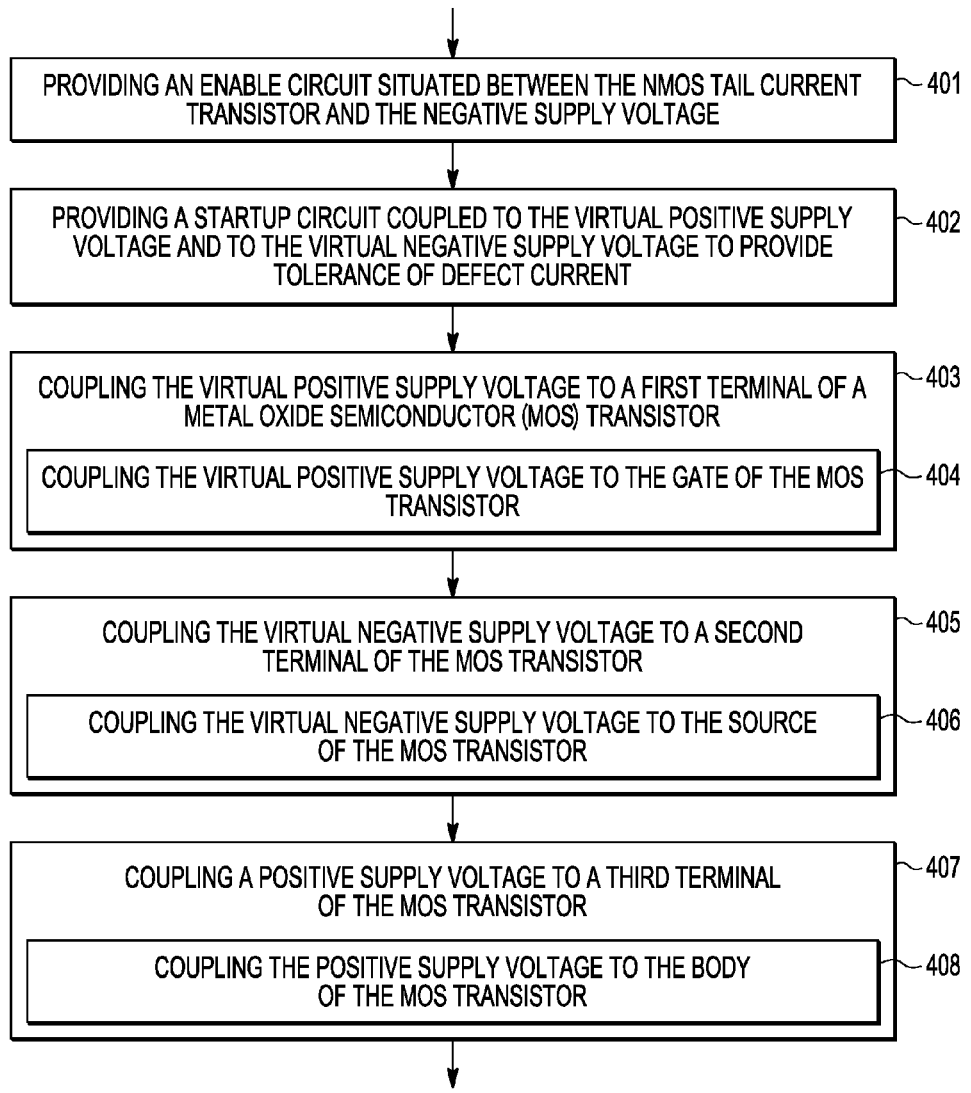
FIGS. 4 and 5 are a block diagram illustrating a method in accordance with at least one embodiment.
Figure 5:
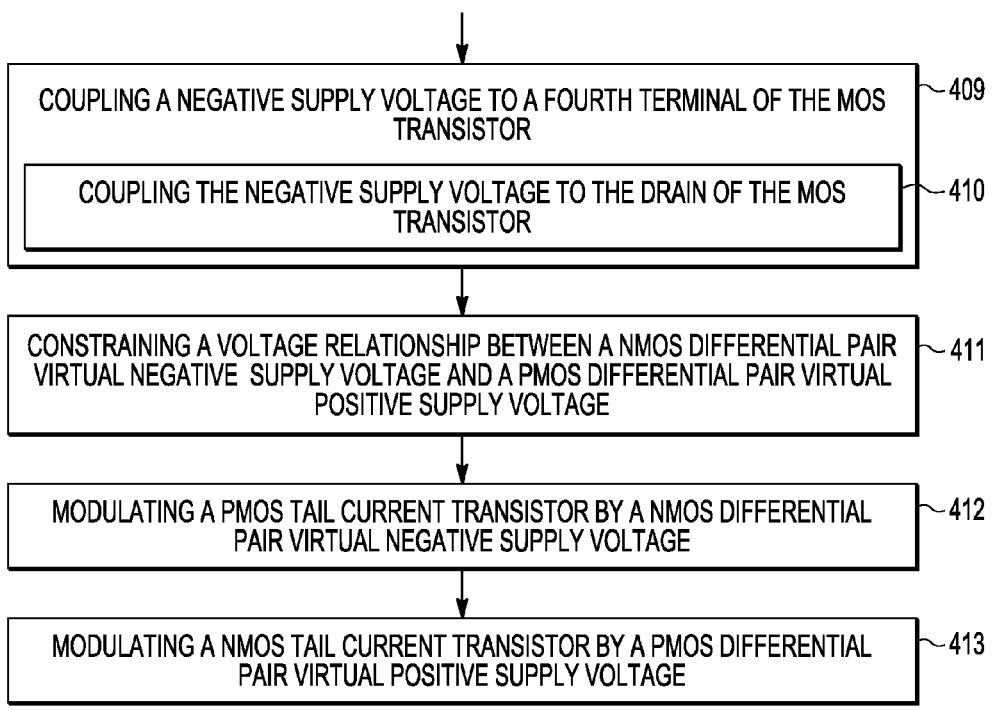

FIGS. 4 and 5 are a block diagram illustrating a method in accordance with at least one embodiment. The method begins in step 401. Step 401 comprises providing an enable circuit situated between the NMOS tail current transistor and the negative supply voltage. From step 401, the method continues to step 402. Step 402 comprises providing a startup circuit coupled to the virtual positive supply voltage and to the virtual negative supply voltage to provide tolerance of defect current. From step 402, the method continues to step 403. In accordance with at least one embodiment, providing such a startup circuit may comprise providing a startup circuit that performs the following steps: On power up, ramping of the positive supply voltage 108 and/or negative supply voltage 109 to its specified voltage (or their specified voltages) begins. As the positive supply voltage 108 is presumed to begin at the same potential as the negative supply voltage 109 (e.g., at zero volts (0V)), an active device in startup circuit 107 (e.g., a gate of a PMOS FET in startup circuit 107) is, in effect, turns on (e.g., by the influence of the zero volt (0V) initial potential). Thus, dissipation to negative supply voltage 109 of any charge in virtual negative supply voltage (BIASP) 111 occurs. Then, the PMOS tail current devices start pumping charge into the virtual positive supply voltage (BIASN) 110 (which started, for example, at a nominal zero volts (0V) and now starts rising). Virtual negative supply voltage (BIASP) 111 is momentarily forced low to allow virtual positive supply voltage (BIASN) 110 to rise, and then NMOS tail current transistors engage to pull virtual positive supply voltage (BIASN) 110 toward its intended operating point with the help of PMOS tail current devices. As virtual positive supply voltage (BIASN) 110 rises and virtual negative supply voltage (BIASP) falls, startup circuit 107 (e.g., a PMOS startup transistor in startup circuit 107) shuts off, as its gate rises in potential while its source falls in potential. In order to accommodate a significant amount of defect current, a startup transistor (e.g., a PMOS FET in startup circuit 107) is sized to pass sufficient current such that, on power up, it can "defeat" up to, for example, a three microampere (3 µA) defect applied at both the virtual positive supply voltage (BIASN) 110 and the virtual negative supply voltage (BIASP) 111. Step 403 comprises coupling the virtual positive supply voltage to a first terminal of a metal oxide semiconductor (MOS) transistor. In accordance with at least one embodiment, Step 403 further comprises step 404. Step 404 comprises coupling the virtual positive supply voltage to the gate of the MOS transistor. From step 403, the method continues to step 405. Step 405 comprises coupling the virtual negative supply voltage to a second terminal of the MOS transistor. In accordance with at least one embodiment, step 405 further comprises step 406. Step 406 comprises coupling the virtual negative supply voltage to the source of the MOS transistor. From step 405, the method continues to step 407. Step 407 comprises coupling a positive supply voltage to a third terminal of the MOS transistor. In accordance with at least one embodiment, step 407 further comprises step 408. Step 408 comprises coupling the positive supply voltage to the body of the MOS transistor.

From step 407, the method continues to step 409. Step 409 comprises coupling a negative supply voltage to a fourth terminal of the MOS transistor. In accordance with at least one embodiment, step 409 further comprises step 410. Step 410 comprises coupling the negative supply voltage to the drain of the MOS transistor. From step 409, the method continues to step 411. Step 411 comprises constraining a voltage relationship between a NMOS differential pair virtual negative supply voltage and a PMOS differential pair virtual negative supply voltage. From step 411, the method continues to step 412. Step 412 comprises modulating a PMOS tail current transistor by a NMOS differential pair virtual negative supply voltage. From step 412, the method continues to step 413. Step 413 comprises modulating a NMOS tail current transistor by a PMOS differential pair virtual positive supply voltage.

Figure 6:
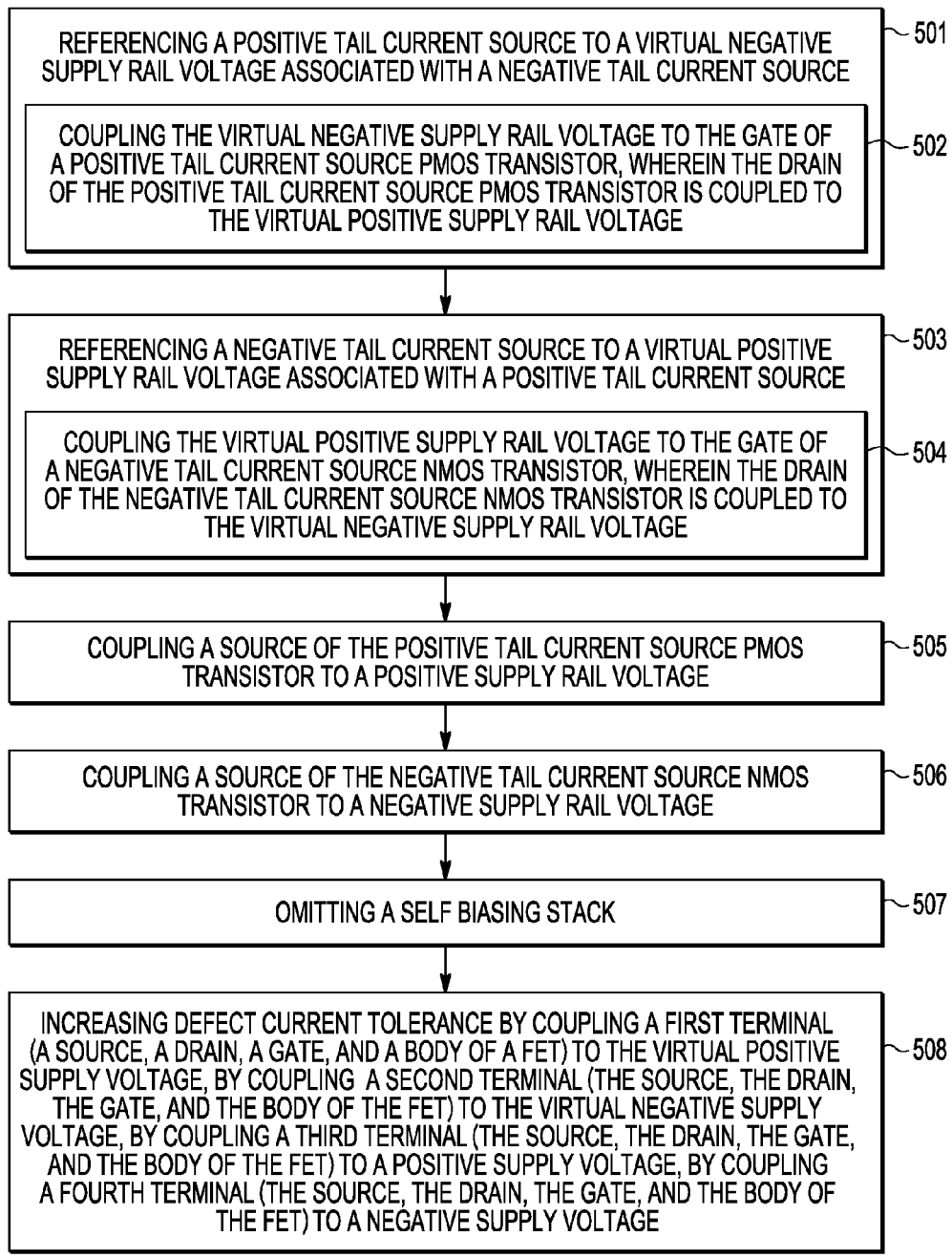
FIG. 6 is a block diagram illustrating a method in accordance with at least one embodiment.

FIG. 6 is a block diagram illustrating a method in accordance with at least one embodiment. The method begins in step 501. Step 501 comprises referencing a positive tail current source to a virtual negative supply rail voltage associated with a negative tail current source. In accordance with at least one embodiment, step 501 further comprises step 502. Step 502 comprises coupling the virtual negative supply rail voltage to the gate of a positive tail current source PMOS transistor, wherein the drain of the positive tail current source PMOS transistor is coupled to the virtual positive supply rail voltage. From step 501, the method continues to step 503. Step 503 comprises referencing a negative tail current source to a virtual positive supply rail voltage associated with the positive tail current source. In accordance with at least one embodiment, step 503 comprises step 504. Step 504 comprises coupling the virtual positive supply rail voltage to the gate of a negative tail current source NMOS transistor, wherein the drain of the negative tail current source NMOS transistor is coupled to the virtual negative supply rail voltage.

From step 503, the method continues to step 505. Step 505 comprises coupling a source of the positive tail current source PMOS transistor to a positive supply rail voltage. From step 505, the method continues to step 506. Step 506 comprises coupling a source of the negative tail current source NMOS transistor to a negative supply rail voltage. From step 506, the method continues to step 507. Step 507 comprises omitting a self-biasing stack. Omitting a self-biasing stack of transistors for providing a sole bias voltage to multiple portions of a differential amplifier can be useful, in accordance with at least one embodiment, for improving output swing (e.g., allowing an output to vary over a larger range of voltage even for differential amplifiers operating at low supply voltages (i.e., small differences between positive supply voltages and negative supply voltages)). Omitting such a self-biasing stack of transistors can also be useful, in accordance with at least one embodiment, for improving the speed (i.e., slew rate/response time/switching time) of a differential amplifier. From step 507, the method continues to step 508. Step 508 comprises increasing defect current tolerance by coupling a first terminal of a FET selected from a group consisting of a source, a drain, a gate, and a body of the FET to a the virtual positive supply voltage, by coupling a second terminal of the FET selected from a group consisting of a source, a drain, a gate, and a body of the FET to the virtual negative supply voltage, by coupling a third terminal of the FET selected from the source, the drain, the gate, and the body of the FET to a positive supply voltage, by coupling a fourth terminal of the FET selected from a group consisting of the source, the drain, the gate, and the body of the FET to a negative supply voltage. The first terminal, the second terminal, the third terminal, and the fourth terminal are mutually exclusive (e.g., if the first terminal is a gate terminal of the FET, none of the second terminal, the third terminal, and the fourth terminal of the FET are the gate terminal of the FET, and, for example, if the second terminal is a source terminal of the FET, none of the first terminal, the third terminal, and the fourth terminal of the FET are the source terminal, and, further, as another example, if the third terminal is a body terminal of the FET, none of the first terminal, the second terminal, and the fourth terminal of the FET are the body terminal, and, also, as another example, if the fourth terminal is a drain terminal of the FET, none of the first terminal, the second terminal, and the third terminal of the FET are the drain terminal). In other words, the first terminal, the second terminal, the third terminal, and the fourth terminal are each a unique terminal among the source terminal, the drain terminal, the gate terminal, and the body terminal of the FET, but according to various embodiments, the relationships of first terminal, the second terminal, the third terminal, and the fourth terminal to the source terminal, the drain terminal, the gate terminal, and the body terminal of the FET may vary from embodiment to embodiment.

While at least one embodiment is illustrated and described as receiving a differential input signal, it should be understood that at least one embodiment may be used as a single-ended (i.e., non-differential) receiver and at least one embodiment may be used as a level shifter. As an example, an embodiment for receiving a differential input signal may be modified by fixing one of the two differential inputs at a fixed voltage, by omitting one side of a differential input stage, and/or by offsetting a voltage of a node to provide at least one embodiment suitable for use as a single-ended receiver and/or a level shifter.

In accordance with at least one embodiment, a method for improving a differential receiver is provided. In accordance with at least one embodiment, the method comprises modulating a positive metal oxide semiconductor (PMOS) tail current transistor by a negative metal oxide semiconductor (NMOS) differential pair virtual negative supply voltage and modulating a NMOS tail current transistor by a PMOS differential pair virtual positive supply voltage. In accordance with at least one embodiment, the PMOS tail current transistor is situated between a positive supply voltage and the virtual positive supply voltage and the NMOS tail current transistor is situated between the virtual negative supply voltage and a negative supply voltage.

In accordance with at least one embodiment, the method further comprises providing an enable circuit situated between the NMOS tail current transistor and the negative supply voltage. In accordance with at least one embodiment, the method further comprises providing a startup circuit coupled to the virtual positive supply voltage and to the virtual negative supply voltage to provide tolerance of defect current.

In accordance with at least one embodiment, the method further comprises coupling the virtual positive supply voltage to a first terminal of a metal oxide semiconductor (MOS) transistor; coupling the virtual negative supply voltage to a second terminal of the MOS transistor; coupling a positive supply voltage to a third terminal of the MOS transistor; and coupling a negative supply voltage to a fourth terminal of the MOS transistor. In accordance with at least one embodiment, the coupling the virtual positive supply voltage to the first terminal of the MOS transistor further comprises coupling the virtual positive supply voltage to the gate of the MOS transistor, the coupling the virtual negative supply voltage to the second terminal of the MOS transistor further comprises coupling the virtual negative supply voltage to the source of the MOS transistor, the coupling the positive supply voltage to the third terminal of the MOS transistor further comprises coupling the positive supply voltage to the body of the MOS transistor, and the coupling the negative supply voltage to the fourth terminal of the MOS transistor further comprises coupling the negative supply voltage to the drain of the MOS transistor.

In accordance with at least one embodiment, providing the startup circuit coupled to the virtual positive supply voltage and to the virtual negative supply voltage to provide tolerance of defect current further comprises coupling the virtual positive supply voltage to a first terminal of a metal oxide semiconductor (MOS) transistor. In accordance with at least one embodiment, providing the startup circuit coupled to the virtual positive supply voltage and to the virtual negative supply voltage to provide tolerance of defect current further comprises coupling the virtual negative supply voltage to a second terminal of the MOS transistor. In accordance with at least one embodiment, providing the startup circuit coupled to the virtual positive supply voltage and to the virtual negative supply voltage to provide tolerance of defect current further comprises coupling a positive supply voltage to a third terminal of the MOS transistor. In accordance with at least one embodiment, providing the startup circuit coupled to the virtual positive supply voltage and to the virtual negative supply voltage to provide tolerance of defect current further comprises coupling a negative supply voltage to a fourth terminal of the MOS transistor. In accordance with at least one embodiment, the coupling the virtual positive supply voltage to the first terminal of the MOS transistor further comprises coupling the virtual positive supply voltage to the gate of the MOS transistor. In accordance with at least one embodiment, the coupling the virtual negative supply voltage to the second terminal of the MOS transistor further comprises coupling the virtual negative supply voltage to the source of the MOS transistor. In accordance with at least one embodiment, the coupling the positive supply voltage to the third terminal of the MOS transistor further comprises coupling the positive supply voltage to the body of the MOS transistor. In accordance with at least one embodiment, the coupling the negative supply voltage to the fourth terminal of the MOS transistor further comprises coupling the negative supply voltage to the drain of the MOS transistor. In accordance with at least one embodiment, at least a portion of the above steps ensure proper startup operation. In accordance with at least one embodiment, at least a portion of the above steps provide tolerance of defect current.

At least one embodiment provides an ability to "program" the tail current source amount for either or both of the positive tail current source and the negative tail current source. By providing separate enable inputs for a tail current source, wherein the separate enable inputs are coupled, respectively, to separate transistors, with each transistor enabling the flow of a respective portion of the total amount of tail current sourced or sunk by the tail current source, the tail current amount may be selected so as to "program" it based on application needs. Thus, at least one embodiment provides at least one programmable tail current source. At least one embodiment comprises receiving a first enable signal at a first enable input, the first enable input coupled to a first tail current source enable transistor, wherein the first tail current source enable transistor enables flow of a first portion of a total amount of tail current and receiving a second enable signal at a second enable input, the second enable input coupled to a second tail current source enable transistor, wherein the second tail current source enable transistor enables flow of a second portion of the total amount of tail current. The first tail current source enable transistor is connected to an element selected from a group consisting of the tail current transistor of the first conductivity type and the tail current transistor of the second conductivity type. The first tail current source enable transistor and the second tail current source enable transistor may be implemented, for example, as NMOS FET 230 and NMOS FET 231, respectively, of enable circuit 106 and/or as a complementary version thereof such enable circuit disposed, for example, between positive supply voltage (e.g., VDD_INT) 108 and positive tail current source 104.

In accordance with at least one embodiment, a method for improving a fully differential and complementary topology is provided. In accordance with at least one embodiment, the method comprises referencing a positive tail current source to a virtual negative supply rail voltage associated with a negative tail current source and referencing the negative tail current source to a virtual positive supply rail voltage associated with the positive tail current source. In accordance with at least one embodiment, the referencing the positive tail current source to the virtual negative supply rail voltage associated with the negative tail current source further comprises coupling the virtual negative supply rail voltage to the gate of a positive tail current source positive metal oxide semiconductor (PMOS) transistor, wherein the drain of the positive tail current source PMOS transistor is coupled to the virtual positive supply rail voltage, and the referencing the negative tail current source to the virtual positive supply rail voltage associated with the positive tail current source further comprises coupling the virtual positive supply rail voltage to the gate of a negative tail current source negative metal oxide semiconductor (NMOS) transistor, wherein the drain of the negative tail current source NMOS transistor is coupled to the virtual negative supply rail voltage. In accordance with at least one embodiment, the source of the positive tail current source PMOS transistor is coupled to a positive supply rail voltage. In accordance with at least one embodiment, the source of the negative tail current source NMOS transistor is coupled to a negative supply rail voltage.

In accordance with at least one embodiment, the method further comprises omitting a self-biasing transistor stack to improve the output swing and speed. In accordance with at least one embodiment, the method further comprises increasing defect current tolerance by coupling a first terminal selected from a group consisting of a source, a drain, a gate, and a body of a field effect transistor (FET) to the virtual positive supply voltage, by coupling a second terminal selected from the group consisting of the source, the drain, the gate, and the body of the FET to the virtual negative supply voltage, by coupling a third terminal selected from the group consisting of the source, the drain, the gate, and the body of the FET to a positive supply voltage, by coupling a fourth terminal selected from the group consisting of the source, the drain, the gate, and the body of the FET to a negative supply voltage.

In accordance with at least one embodiment, a self-biased receiver is provided. In accordance with at least one embodiment, a positive supply voltage is coupled to a positive tail current source, the positive tail current source providing a virtual positive supply voltage; a negative supply voltage is coupled to a negative tail current source, the negative tail current source providing a virtual negative supply voltage; a differential amplifier comprises a positive driver portion coupled to the virtual positive supply voltage and a negative driver portion coupled to the virtual negative supply voltage. The virtual positive supply voltage controls the negative tail current source, and the virtual negative supply voltage controls the positive tail current source.

In accordance with at least one embodiment, the positive tail current source comprises a positive metal oxide semiconductor (PMOS) transistor, wherein the gate of the PMOS transistor is coupled to the virtual negative supply voltage, wherein the source of the PMOS transistor is coupled to the positive supply voltage, and wherein the drain of the PMOS transistor is coupled to the virtual positive supply voltage. In accordance with at least one embodiment, the negative tail current source comprises a negative metal oxide semiconductor (NMOS) transistor, wherein the gate of the NMOS transistor is coupled to the virtual positive supply voltage, wherein the source of the NMOS transistor is coupled to the negative supply voltage, and wherein the drain of the NMOS transistor is coupled to the virtual negative supply voltage.

In accordance with at least one embodiment, the self-biased receiver further comprises an enable circuit, wherein the enable circuit selectively couples the source of the NMOS transistor to the negative supply voltage. In accordance with at least one embodiment, the self-biased receiver includes a startup circuit, the startup circuit coupled to the virtual positive supply voltage and to the virtual negative supply voltage. In accordance with at least one embodiment, the startup circuit further comprises a metal oxide semiconductor (MOS) transistor, wherein a first terminal of the MOS transistor is coupled to the virtual positive supply voltage, wherein a second terminal of the MOS transistor is coupled to the virtual negative supply voltage, wherein a third terminal of the MOS transistor is coupled to the negative supply voltage, and wherein a fourth terminal of the MOS transistor is coupled to the positive supply voltage. In accordance with at least one embodiment, the MOS transistor further comprises a second PMOS transistor, wherein the gate of the second PMOS transistor is coupled to the virtual positive supply voltage, wherein the source of the second PMOS transistor is coupled to the virtual negative supply voltage, wherein the drain of the second PMOS transistor is coupled to the negative supply voltage, and wherein the body of the second PMOS transistor is coupled to the positive supply voltage. In accordance with at least one embodiment, the startup circuit provides a defect current tolerance of at least three microamperes.

In accordance with at least one embodiment, various FETs described herein are illustrated with their body terminals coupled to various potentials (i.e., voltages). Some bodies are tied to supplies, whereas others are tied to sources. It should be understood that the body terminal connections could be to various potentials (e.g., those of supplies or sources) based on performance/power/area/etc. considerations. Moreover, in some cases, body terminals of FETs could be connected to other FET terminals (e.g., gate terminals or drain terminals).

What is claimed is:

1. A method for operating a differential receiver comprising:
    modulating a tail current transistor of a first conductivity type by a virtual negative supply voltage, wherein the tail current transistor of the first conductivity type is situated between a positive supply voltage and a virtual positive supply voltage; and
    modulating a tail current transistor of a second conductivity type by the virtual positive supply voltage, wherein the tail current transistor of the second conductivity type is situated between the virtual negative supply voltage and a negative supply voltage.

2. The method of claim 1 further comprising:
    receiving a first enable signal at a first enable input, the first enable input coupled to a first tail current source enable transistor, wherein the first tail current source enable transistor enables flow of a first portion of a total amount of tail current, wherein the first tail current source enable transistor is coupled to an element selected from a group consisting of the tail current transistor of the first conductivity type and the tail current transistor of the second conductivity type; and
    receiving a second enable signal at a second enable input, the second enable input coupled to a second tail current source enable transistor, wherein the second tail current source enable transistor enables flow of a second portion of the total amount of tail current.

3. The method of claim 1 further comprising:
    providing a startup circuit coupled to the virtual positive supply voltage and to the virtual negative supply voltage to provide tolerance of defect current.

4. The method of claim 1 further comprising:
    coupling the virtual positive supply voltage to a first terminal of a metal oxide semiconductor (MOS) transistor;
    coupling the virtual negative supply voltage to a second terminal of the MOS transistor; and
    coupling a negative supply voltage to a third terminal of the MOS transistor.

5. The method of claim 4 further comprising:
    providing an enable circuit situated between the tail current transistor of the second conductivity type and the negative supply voltage.

6. The method of claim 4 further comprising:
    providing an enable circuit situated between the tail current transistor of the first conductivity type and the positive supply voltage.

7. The method of claim 4 further comprising:
    coupling the positive supply voltage to the body of the MOS transistor, wherein the coupling the virtual positive supply voltage to the first terminal of the MOS transistor further comprises:
coupling the virtual positive supply voltage to the gate of the MOS transistor,
wherein the coupling the virtual negative supply voltage to the second terminal of the MOS transistor further comprises:
coupling the virtual negative supply voltage to the source of the MOS transistor, and
wherein the coupling the negative supply voltage to the third terminal of the MOS transistor further comprises:
coupling the negative supply voltage to the drain of the MOS transistor.

8. A method for operating a fully differential and complementary topology comprising:
coupling a first terminal selected from a group consisting of a source, a drain, a gate, and a body of a field effect transistor (FET) to the virtual positive supply voltage;
coupling a second terminal selected from the group consisting of the source, the drain, the gate, and the body of the FET to the virtual negative supply voltage;
coupling a third terminal selected from the group consisting of the source, the drain, the gate, and the body of the FET to a positive supply voltage;
coupling a fourth terminal selected from the group consisting of the source, the drain, the gate, and the body of the FET to a negative supply voltage;
referencing a positive tail current source to a virtual negative supply rail voltage associated with a negative tail current source; and
referencing the negative tail current source to a virtual positive supply rail voltage associated with the positive tail current source.

9. The method of claim 8 wherein the referencing the positive tail current source to the virtual negative supply rail voltage associated with the negative tail current source further comprises:
coupling the virtual negative supply rail voltage to the gate of a positive tail current source positive metal oxide semiconductor (PMOS) transistor, wherein the drain of the positive tail current source PMOS transistor is coupled to the virtual positive supply rail voltage; and
wherein the referencing the negative tail current source to the virtual positive supply rail voltage associated with the positive tail current source further comprises:
coupling the virtual positive supply rail voltage to the gate of a negative tail current source negative metal oxide semiconductor (NMOS) transistor, wherein the drain of the negative tail current source NMOS transistor is coupled to the virtual negative supply rail voltage.

10. The method of claim 9 wherein the source of the positive tail current source PMOS transistor is coupled to a positive supply rail voltage and the source of the negative tail current source NMOS transistor is coupled to a negative supply rail voltage.

11. The method of claim 8 wherein said coupling said first terminal, coupling said second terminal, coupling said third terminal, and coupling said fourth terminal increase defect current tolerance.

12. A self-biased receiver comprising:
a positive supply voltage coupled to a positive tail current source, the positive tail current source providing a virtual positive supply voltage;
a negative supply voltage coupled to a negative tail current source, the negative tail current source providing a virtual negative supply voltage;
a differential amplifier comprising a positive driver portion coupled to the virtual positive supply voltage and a negative driver portion coupled to the virtual negative supply voltage, the virtual positive supply voltage controlling the negative tail current source, and the virtual negative supply voltage controlling the positive tail current source; and
a startup circuit, the startup circuit coupled to the virtual positive supply voltage and to the virtual negative supply voltage.

13. The self-biased receiver of claim 12 wherein the positive tail current source comprises:
a positive metal oxide semiconductor (PMOS) transistor, wherein the gate of the PMOS transistor is coupled to the virtual negative supply voltage, wherein the source of the PMOS transistor is coupled to the positive supply voltage, and wherein the drain of the PMOS transistor is coupled to the virtual positive supply voltage.

14. The self-biased receiver of claim 13 wherein the negative tail current source comprises:
a negative metal oxide semiconductor (NMOS) transistor, wherein the gate of the NMOS transistor is coupled to the virtual positive supply voltage, wherein the source of the NMOS transistor is coupled to the negative supply voltage, and wherein the drain of the NMOS transistor is coupled to the virtual negative supply voltage.

15. The self-biased receiver of claim 14 further comprising:
an enable circuit, wherein the enable circuit selectively couples the source of the NMOS transistor to the negative supply voltage.

16. The self-biased receiver of claim 12 wherein the startup circuit further comprises:
a metal oxide semiconductor (MOS) transistor, wherein a first terminal of the MOS transistor is coupled to the virtual positive supply voltage, wherein a second terminal of the MOS transistor is coupled to the virtual negative supply voltage, wherein a third terminal of the MOS transistor is coupled to the negative supply voltage, and wherein a fourth terminal of the MOS transistor is coupled to the positive supply voltage.

17. The self-biased receiver of claim 16 wherein the MOS transistor further comprises:
a second PMOS transistor, wherein the gate of the second PMOS transistor is coupled to the virtual positive supply voltage, wherein the source of the second PMOS transistor is coupled to the virtual negative supply voltage, wherein the drain of the second PMOS transistor is coupled to the negative supply voltage, and wherein the body of the second PMOS transistor is coupled to the positive supply voltage.

18. The self-biased receiver of claim 12 wherein the startup circuit provides a defect current tolerance of at least three microamperes.

19. A method for operating a differential receiver comprising:
modulating a tail current transistor of a first conductivity type by a virtual negative supply voltage;
modulating a tail current transistor of a second conductivity type by a virtual positive supply voltage; and
providing a startup circuit coupled to the virtual positive supply voltage and to the virtual negative supply voltage to provide tolerance of defect current.

* * * * *